United States Patent [19]

Fierkens

[11] Patent Number: 5,146,662
[45] Date of Patent: Sep. 15, 1992

[54] LEAD FRAME CUTTING APPARATUS FOR VARIOUS SIZED INTEGRATED CIRCUIT PACKAGES AND METHOD THEREFOR

[76] Inventor: Richard H. J. Fierkens, Keurbeck 15, 6914 AE Herwen, Netherlands

[21] Appl. No.: 814,504

[22] Filed: Dec. 30, 1991

[51] Int. Cl.$^5$ ............................................. H01L 21/60
[52] U.S. Cl. .................................. 29/25.03; 437/209; 437/220; 174/52.4; 29/827
[58] Field of Search .................... 29/25.01, 25.03, 827, 29/854; 437/209, 217, 214, 220, 219; 156/250, 242; 174/52.4

[56] References Cited

U.S. PATENT DOCUMENTS

| | | | |
|---|---|---|---|
| 4,642,876 | 2/1987 | Murray et al. | 29/25.03 |
| 4,741,787 | 5/1988 | Shimizu et al. | 29/25.01 |
| 4,816,427 | 3/1989 | Dennis | 437/209 |
| 4,850,103 | 7/1989 | Takemoto et al. | 29/827 |
| 4,852,250 | 8/1989 | Andrews | 174/52.4 |
| 4,859,632 | 8/1989 | Lumbard | 437/209 |
| 4,885,837 | 12/1989 | Eshima et al. | 29/827 |
| 5,023,751 | 6/1991 | Stampfli | 156/250 |
| 5,092,031 | 3/1992 | Sato et al. | 175/52.4 |

FOREIGN PATENT DOCUMENTS

| | | | |
|---|---|---|---|
| 55-72045 | 5/1980 | Japan | 437/220 |
| 212031 | 9/1986 | Japan | 437/220 |

Primary Examiner—Brian E. Hearn
Assistant Examiner—Kevin M. Picardat
Attorney, Agent, or Firm—Harry M. Weiss

[57] ABSTRACT

A lead frame cutting apparatus for various sized integrated circuit packages and method therefor is disclosed. This apparatus employs punches in conjunction with a thin L-shaped cutting plate, which is also symmetrical, allowing both sides to be used. This thin cutting plate is fabricated as one of a plurality of thin cutting plates using a relatively inexpensive single cutting process that cuts all the thin cutting plates in one cutting operation thereby saving money and time compared to the machined, thick cutting plate of the prior art. The L-shape of the cutting plate and the use of the associated punches allows integrated circuit packages of different sizes to be processed with the apparatus of the present invention using a two-pass approach. The integrated circuit package is positioned correctly on the L-shaped cutting plate, and the punches perform the cutting function on two of the four sides of the lead frame. The integrated circuit package is then rotated 180 degrees, and the remaining two sides of the lead frame are cut. In this manner several different sizes of integrated circuits can be processed with the cutting apparatus without changing the punch or cutting plate setup.

11 Claims, 2 Drawing Sheets

LEAD FRAME CUTTING APPARATUS FOR VARIOUS SIZED INTEGRATED CIRCUIT PACKAGES AND METHOD THEREFOR

FIELD OF THE INVENTION

This invention generally relates to semiconductor processing apparatus and methods, and more specifically relates to a lead frame cutting apparatus for various sized integrated circuit packages and method therefor for cutting the dam bar that interconnects leads on a typical lead frame after the semiconductor chip has been packaged, and for cutting the leads on the lead frame to the appropriate length. This apparatus can be configured to cut the lead frames from several different sizes of integrated circuit packages, eliminating setup time for each different size of integrated circuit package to be processed.

RELATED PATENT APPLICATIONS

This application is related to the patent application entitled "IMPROVED LEAD FRAME CUTTING APPARATUS FOR INTEGRATED CIRCUIT PACKAGES AND METHOD THEREFOR" filed concurrently herewith in the name of the same inventor.

DESCRIPTION OF THE PRIOR ART

The prior art apparatus and method for cutting dam bars from between the leads of a lead frame on an integrated circuit package used individual punches in conjunction with a lower cutting plate which had recesses corresponding to each portion of the lead frame to be removed. The packaged semiconductor device with associated lead frame was placed in position on the cutting plate, and the individual punches, which were mounted in an automated punching tool, were pressed down on the lead frame to punch out the dam bars that interconnect the leads on a typical lead frame. A single punch could be used by moving the punch to an appropriate location on the lead frame and punching out a single portion of the dam bar, and positioning the punch to the next desired portion to be punched and repeating the punching process until all desired portions of the dam bar had been removed. In a more common application, a group of punches were gang mounted in the automated punching tool such that all desired portions of the dam bar are removed with a single cutting stroke of the automated punching tool.

The prior art punch has a cutting edge that is substantially square in cross-section. The cutting end of the punch is slightly narrower than the corresponding recess in the cutting plate so the force on the dam bar between the punch and the cutting plate creates a shearing action which cuts the portion of the dam bar to be removed. When the cutting portion of the punch becomes dull through use, the punch must be replaced with a new punch.

Similar punches are used to cut the leads to the appropriate length after the dam bars are removed. The cutting plate is similar in construction to the cutting plate used for the dam bar cutting, but has recesses in different areas to allow cutting the leads of the lead frame to the appropriate length.

The prior art cutting plate is machined from a single thick piece of metal to form a cutting die with recesses in the appropriate locations. The high precision machining required to manufacture a cutting plate makes the cutting plate quite expensive. Although the cutting plate will last for numerous cutting cycles, the replacement cost is high when the cutting plate gets worn through use.

In addition, the prior art lead frame cutting apparatus has a different cutting plate and punch holder attachment for the automated punching tool for each size of integrated circuit to be processed with the apparatus. With this configuration, the operator of the apparatus must shut the apparatus off, remove the cutting plate and associated punch holder, and install a different cutting plate and associated punch before the next size of integrated circuit can be processed. With this type of system, much time is spent taking apart the old setup and setting up the apparatus for the next run.

Therefore, there existed a need to provide a lead frame cutting apparatus for various sized integrated circuit packages and method therefor which uses punches and a thin cutting plate arranged to cut half of the leads of the lead frame, and which uses a two-pass system such that the integrated circuit package is placed in the apparatus, half of the lead frame leads are cut, the integrated circuit package is rotated 180 degrees, and the other half of the lead frame leads are cut. In this configuration, the apparatus can be used to process many different sizes of integrated circuit packages without taking down and setting up the apparatus for each different size of integrated circuit package.

SUMMARY OF THE INVENTION

It is an object of this invention to provide a lead frame cutting apparatus for various sized integrated circuit packages and method therefor which uses multiple punches in conjunction with a thin cutting plate that can be inexpensively manufactured with a number of other thin cutting plates using a single cutting process.

It is another object of this invention to provide a lead frame cutting apparatus for various sized integrated circuit packages and method therefor which uses a two-pass approach, cutting half of the leads of the lead frame on the first pass, rotating the integrated circuit package 180 degrees, and cutting the remaining half of the leads of the lead frame on the second pass.

It is a further object of this invention to provide a lead frame cutting apparatus for various sized integrated circuit packages and method therefor which can be used in one configuration to cut the lead frames of several different sizes of integrated circuit packages.

According to the present invention, an integrated circuit with associated packaging including a lead frame is provided. This lead frame of the integrated circuit package must be cut to remove the dam bars connecting the leads, and to trim the leads to the appropriate length. An automated punching tool is provided to appropriately cut the dam bars on the lead frame of the integrated circuit package. This automated punching tool is equipped with one or more dam bar punches that have a substantially rectangular cutting surface.

In conjunction with the automated punching tool which is equipped with the dam bar punches, a thin dam bar cutting plate is provided. This thin plate is manufactured at the same time as a number of other thin plates using a single cutting process, as opposed to the time consuming precise machining process used to manufacture a single cutting plate of the prior art, thereby greatly reducing the cost of fabricating each thin cutting plate. In addition, when one side of the dam bar cutting plate gets damaged or dull from use, it can be rotated (turned upside down) to provide a new cutting surface without replacing the dam bar cutting plate. Even though the cutting edge of the thin dam bar cutting plate will not withstand as many cutting cycles as the cutting edge of the thick, machined cutting plate of the prior art, the very inexpensive manufacturing cost of the thin dam bar cutting plate allows frequent replacement of the dam bar cutting plate while still realizing significant cost savings when compared to using the thick, machined cutting plate.

Once the dam bars are removed from the lead frame, the leads on the lead frame must be cut to the appropriate length. The automated punching tool is equipped with lead length punches for cutting the leads of the lead frame to the appropriate length. These lead length punches are rectangular in shape, and cut all the leads along one side of the lead frame in one cutting stroke of the automated punching tool.

The lead length cutting of the lead frame is accomplished by using a thin lead length cutting plate, similar to the cutting plate used for the dam bar cutting. This thin lead length cutting plate is stamped, and therefore relatively inexpensive to manufacture, and can be rotated (turned upside down) to provide a new cutting surface without replacing the lead length cutting plate. As is the case for the dam bar cutting plate, great cost savings can be realized by using the thin, relatively inexpensive lead length cutting plate for cutting the leads to length when compared to the cost of using the thick, machined cutting plate of the prior art.

The punches and associated cutting plates for both the dam bar cutting operation and the lead length cutting operation are configured to cut half of the leads of the lead frame of the largest integrated circuit package to be processed with the apparatus. The integrated circuit package is positioned on the apparatus, half of the leads of the lead frame are cut, the integrated circuit package is rotated 180 degrees, and the remaining half of the leads of the lead frame are cut. Since the punches and associated cutting plate are designed for the largest integrated circuit package that the apparatus will have to process, smaller integrated circuit packages of the same type can be processed on the apparatus without changing the configuration of the punches or cutting plate.

The foregoing and other objects, features and advantages will be apparent from the following description of the preferred embodiment of the invention as illustrated in the accompanying drawings.

DESCRIPTION OF THE PREFERRED EMBODIMENT

Figure 3A:
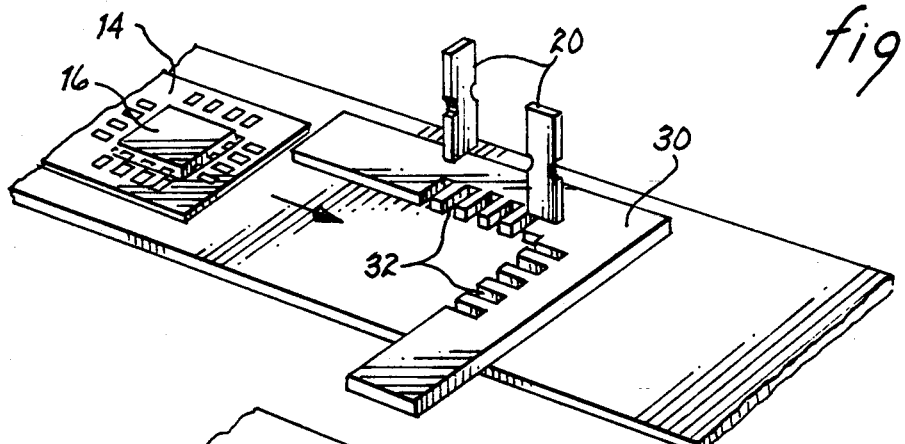
FIG. 3a is a perspective view of an unprocessed integrated circuit package, dam bar punches, and dam bar cutting plate of the present invention.

The apparatus of the present invention provides a method for cutting the dam bars on an integrated circuit lead frame using a two-pass process, and for trimming the leads to the appropriate length using a similar two-pass process. The operation of this lead frame cutting apparatus is best understood by referring to the figures. As shown in FIG. 3a, this apparatus, when configured for cutting dam bars, comprises dam bar punches 20 and a cutting plate 30, which operate on an integrated circuit package 16 with associated lead frame 14. The cutting plate 30 is typically in an L-shape as shown, with the two sides having as many recesses 32 as there are dam bar portions to be removed on the largest integrated circuit lead frame to be processed with this apparatus. In like manner there are typically as many dam bar punches 20 as recesses 32. The integrated circuit package 16 with associated lead frame 14 is placed on the dam bar cutting plate 30 in the appropriate position. The punches 20 shear the unwanted dam bar portions into and through recesses 32 of dam bar cutting plate 30.

The dam bar cutting plate 30 of the present invention offers significant advantages over the machined cutting plate of the prior art. Since a plurality of the cutting plates 30 can be manufactured using thin sheet metal plates in a single cutting process, the cost of the dam bar cutting plate 30 is much less than the cost of the prior art, thick machined cutting plate. While the thin dam bar cutting plate 30 of the present invention will require replacement more frequently that would the machined cutting plate of the prior art, the cost of the thin dam bar cutting plate 30 is so much less that a great cost benefit accrues over time, even after accounting for the increased number of cutting plates 30 used. In addition, the thin, dam bar cutting plate 30 can be reversed (turned upside down) once the top side is damaged or worn, thereby providing a new cutting face, and extending the life of the dam bar cutting plate 30 to twice what it would otherwise be.

For illustrative purposes, an integrated circuit package commonly known as a quad flat pack 16 is shown in the figures, with its associated lead frame 14. Note that this specific example is for illustration only, and many different types of integrated circuit packages and configurations could be used in conjunction with the apparatus of the present invention.

Figure 1:
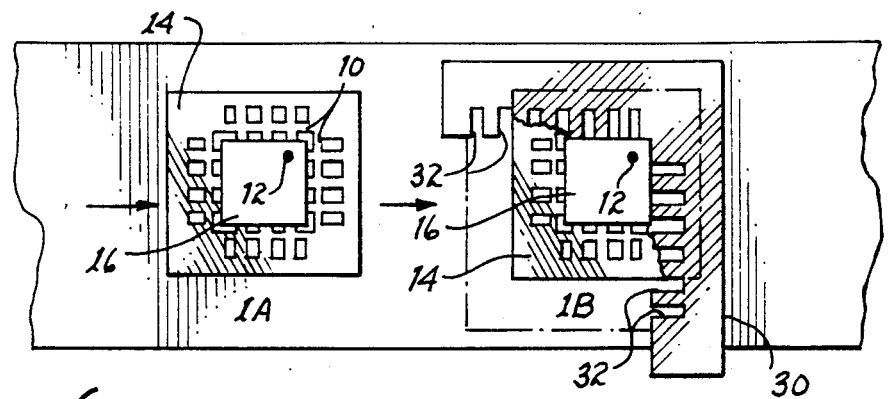
FIG. 1 is a top view of the integrated circuit package and dam bar cutting plate of the present invention used for dam bar cutting of the leads of the lead frame of the integrated circuit package, with an integrated circuit package having the dam bars intact shown both prior to cutting of the dam bars and in its first position on the dam bar cutting plate.

The function of the apparatus of the present invention is best understood by referring to FIGS. 1, 2, 4, and 5. FIG. 1 shows in position 1A an integrated circuit package 16 with associated lead frame 14 before any lead frame cutting has been performed. The lead frame 14 of integrated circuit package 16 shown in position 1A has dam bar portions 10 as shown by the shaded portions of the lead frame 14 that need to be removed. Integrated circuit package 16 has a reference mark 12 as shown. Integrated circuit package 16 with associated lead frame 14 is placed on dam bar cutting plate 30 as shown in position 1B of FIG. 1, with reference mark 12 in the upper right corner as shown. Note that the lead frame 14 of integrated circuit package 16 is partially cut away in position 1B to reveal the dam bar cutting plate 30 below. Once the integrated circuit package 16 with associated lead frame 14 are correctly in position 1B as shown, the automated punching tool (not shown) with dam bar punches 20 mounted therein shear away the dam bar portions 10 on the top and right side of lead frame 14. At this point, half of the dam bar portions 10 have been removed from lead frame 14.

Figure 2:
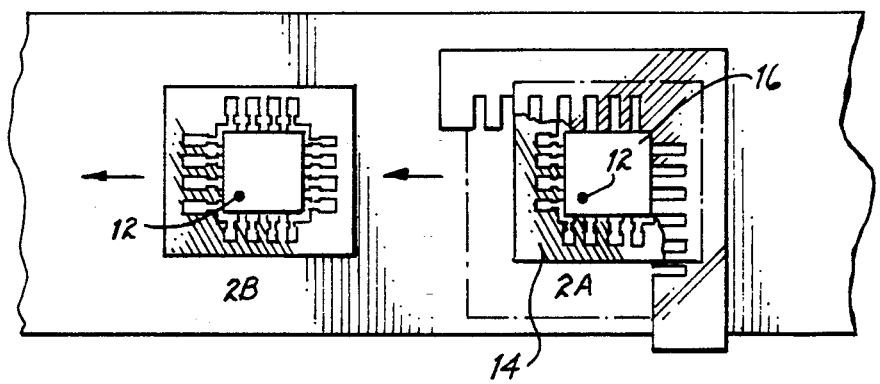
FIG. 2 is a top view of the integrated circuit package and dam bar cutting plate shown in FIG. 1 with the integrated circuit package shown in its second position on the dam bar cutting plate, and with the integrated circuit package shown after cutting of the dam bars are complete.
Figure 3B:
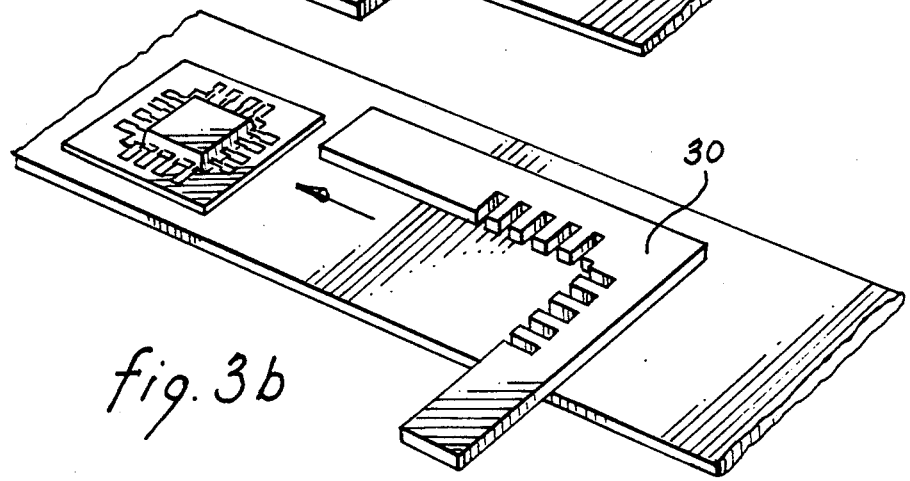
FIG. 3b is a perspective view of an integrated circuit package with dam bars removed, and dam bar cutting plate of the present invention.

To remove the remaining dam bar portions 10 of lead frame 14, the integrated circuit package 16 with associated lead frame 14 is rotated 180 degrees until reference mark 12 is in the lower left corner as shown in position 2A of FIG. 2. Once the integrated circuit package 16 and associated lead frame 14 are in position 2A, the automated punching tool (not shown) with dam bar punches 20 shear away the remaining dam bar portions 10 on lead frame 14. Once all the dam bar portions 10 have been removed, the lead frame appears as shown in position 2B of FIG. 2, and in FIG. 3b. At this point, the leads must be cut to the appropriate length.

Figure 6A:
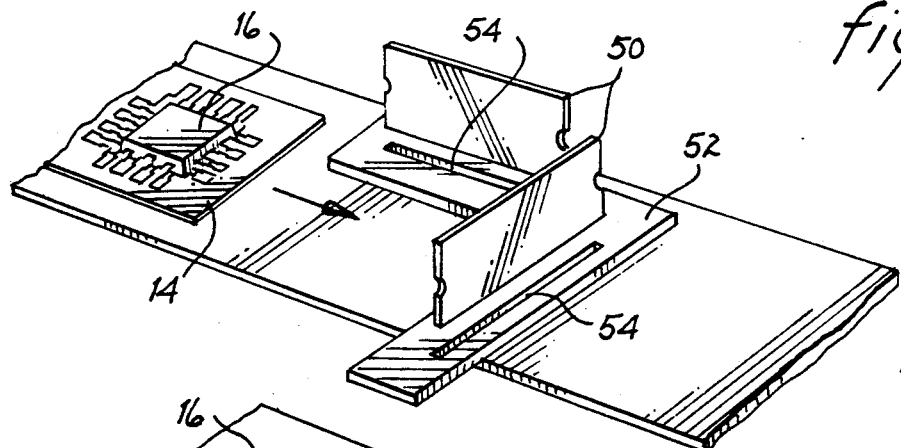
FIG. 6a is a perspective view of an integrated circuit package before lead length cutting, lead length punches, and lead length cutting plate of the present invention.

As shown in FIG. 6a, this apparatus when configured for cutting the leads of a lead frame to length comprises lead length punches 50 and a lead length cutting plate 52, which operate on an integrated circuit package 16 with associated lead frame 14. The lead length cutting plate 52 is preferably L-shaped, with each side having a slot 54 that corresponds to the lead length punches 50. The length of lead length punches 50 and slots 52 are long enough that the apparatus can cut all the leads along one side of the largest integrated circuit package to be processed with this apparatus in a single cutting stroke. The integrated circuit package 16 with associated lead frame 14 is placed on the lead length cutting plate 52 in the appropriate position. The punches 50 shear portions of lead frame 14 through recesses 54 of lead length cutting plate 50, thereby cutting the leads of the lead frame to the appropriate length.

The lead length cutting plate 52 of the present invention is (like the cutting plate 30) manufactured using a plurality (i.e. ten) thin sheets of metal that are preferably about 0.06 inches thick to permit all of the thin sheets of metal to be cut or configured in one cutting process, and has the same cost benefits and reversibility feature as the dam bar cutting plate 30 discussed previously.

Figure 4:
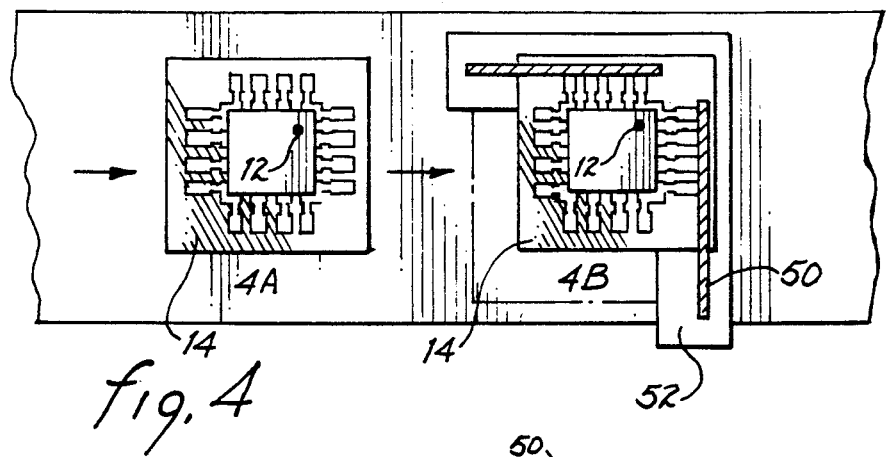
FIG. 4 is a top view of the integrated circuit package and lead length cutting plate of the present invention used for lead length cutting of the leads of the lead frame of the integrated circuit package, with an integrated circuit package shown prior to any lead length cutting in its first position on the lead length cutting plate.
Figure 5:
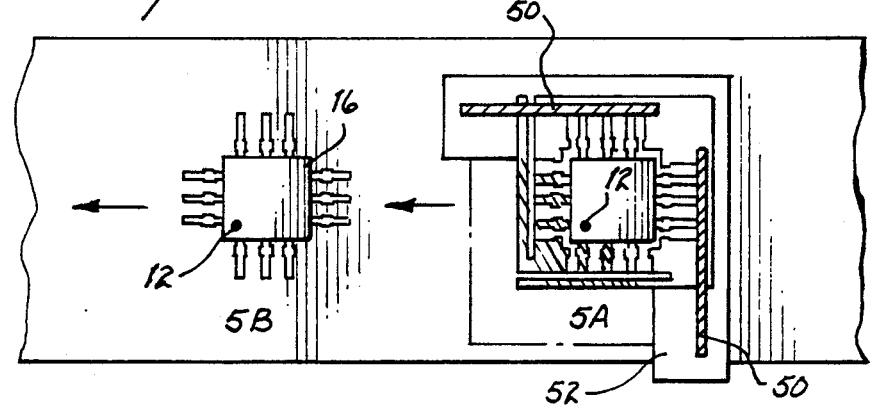
FIG. 5 is a top view of the integrated circuit package and lead length cutting plate shown in FIG. 4 with the integrated circuit package shown in its second position on the lead length cutting plate, and with the integrated circuit package shown after the lead length cutting is complete.

The cutting of leads on lead frame 14 to the proper length can best be understood by referring to FIGS. 4 and 5. FIG. 4 shows in position 4A an integrated circuit package 16 with associated lead frame 14 after dam bar cutting and before lead length cutting of lead frame 14 has been performed. Integrated circuit package 16 has a reference mark 12 as shown. Integrated circuit package 16 with associated lead frame 14 is placed on lead length cutting plate 52 as shown in position 4B of FIG. 4, with reference mark 12 in the upper right corner as shown. Once the integrated circuit package 16 with associated lead frame 14 are correctly in position 4B as shown, the automated punching tool (not shown) with lead length punches 50 mounted therein shear away portions on the top and right side of lead frame 14, thereby cutting the leads on the top and right sides of lead frame 14 to the proper length. At this point half of the leads on lead frame 14 have been cut to the proper length.

Figure 6B:
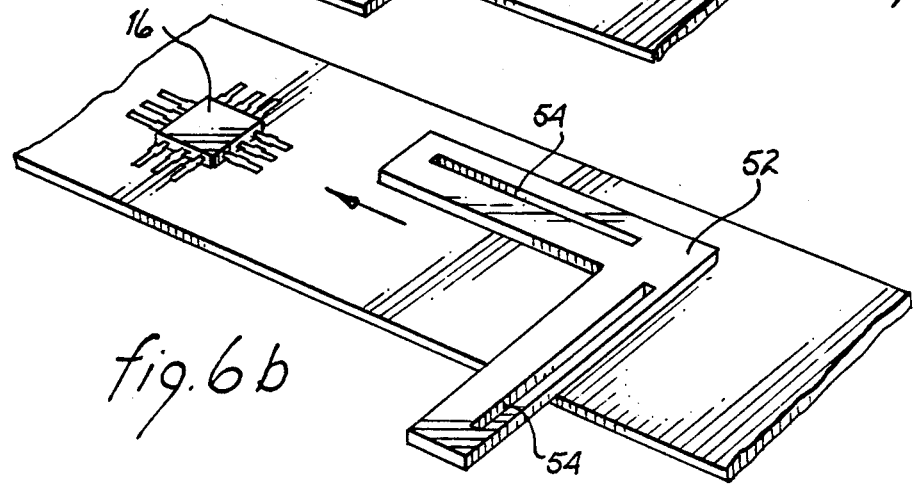
FIG. 6b is a perspective view of an integrated circuit package after lead length cutting, and lead length cutting plate of the present invention.

To cut the remaining leads of lead frame 14 to the proper length, the integrated circuit package 16 with associated lead frame 14 is rotated 180 degrees until reference mark 12 is in the lower left corner as shown in position 5A of FIG. 5. Once the integrated circuit package 16 and associated lead frame 14 are in position 5A, the automated punching tool (not shown) with punches 50 mounted therein shear away the remaining unneeded portions on lead frame 14, thereby cutting the remainder of the leads to the proper length. Once all the leads have been cut to the proper length, the integrated circuit package 16 appears as shown in position 5B of FIG. 5 and in FIG. 6b.

OPERATION

The integrated circuit package 16 with associated lead frame 14 is fed into the proper position on the cutting apparatus using automatic handling techniques. Once properly in place in position 1B of FIG. 1, the automated punching tool makes one stroke downwards until the dam bar punches 20 are pressed within the recesses 32 in dam bar cutting plate 30, thereby punching out all unwanted portions of the dam bar on two of the four sides of the lead frame 14. The integrated circuit package 16 with associated lead frame 14 is then rotated 180 degrees and repositioned into the cutting apparatus, as shown in position 2A of FIG. 2. Once properly in place in position 2A, the automated punching tool makes one stroke downwards until the dam bar punches are pressed within the recesses in dam bar cutting plate 30, thereby punching out the unwanted portions of the dam bar on the remaining two sides of the lead frame 14. The integrated circuit package 16 with associated lead frame 14, which has now had the dam bars removed, is then taken by automatic handling means to the next operation, which is typically the trimming of the leads to their proper length.

Once again the integrated circuit package 16 and associated lead frame 14 are positioned in the cutting apparatus to position 4B shown in FIG. 4 with automatic handling techniques. Once in place, the automated punching tool makes one stroke downward until the lead length punches 50 are within the recesses 54 in the lead length cutting plate 52, which shears off all unwanted portions on two of the four sides of the lead frame 14, thereby cutting the leads on these two sides to the proper length. The integrated circuit package 16 with associated lead frame 14 is then rotated 180 degrees and repositioned into the cutting apparatus, as shown in position 5A of FIG. 5. Once properly in place in position 5A, the automated punching tool makes one stroke downwards until the lead length punches 50 are pressed within the recesses 54 in lead length cutting plate 52, which shears off the remaining unwanted portions of lead frame 14, thereby trimming the remaining leads to the proper length. Since the lead frame 14 of the integrated circuit package 16 previously had the dam bars removed, the cutting of the leads to the proper length yields a quad flat pack. Subsequent operations could be used to shape and form the leads to the desired configuration.

This approach of making two passes to accomplish the desired cutting function has advantages relating to equipment setup time. The L-shape of the cutting plates and the use of the associated punches allows several different sizes of integrated circuits to be processed with the same punch/cutting plate combination. This feature allows the cutting apparatus to be used without modifications for several different sizes of integrated circuit packages, greatly reducing down time of the cutting apparatus due to a change in the size of integrated circuit packages to be processed.

While the invention has been described in its preferred embodiment, it is to be understood that the words which have been used are words of description rather than limitation, and that changes may be made within the purview of the appended claims without departing from the true scope and spirit of the invention in its broader aspects. For example, the apparatus of the present invention could be used in like manner to cut the lead frame of an integrated circuit package in a dual in-line (DIP) package by cutting one side of the lead frame, rotating the integrated circuit package 180 degrees, and cutting the other side of the lead frame.

I claim:

1. A lead frame cutting apparatus for integrated circuit packages comprising, in combination:
    an integrated circuit package comprising, in combination:
        a lead frame comprising a base portion having metal leads that extend from said base portion, and having dam bar metal interconnections located adjacent to said base portion between said metal leads of said lead frame, and having an outer metal frame interconnecting all of said metal leads, said dam bar interconnections and said outer metal frame comprising portions to be removed from said lead frame;
        a semiconductor chip fixedly attached to said base portion of said lead frame and having bonding wires connecting portions of said semiconductor chip to said metal leads of said lead frame; and
        means for protecting and surrounding said semiconductor chip and said base portion of said lead frame such that said metal leads of said lead frame extend to the exterior of said semiconductor chip;
    a thin L-shaped cutting plate upon which said integrated circuit package is placed having recesses that correspond to half of said portions to be removed from said lead; and
    punching tool means having removable punch means aligned with said recesses in said thin L-shaped cutting plate for exerting a downward force on half of said dam bar interconnection for pressing said dam bar interconnections of said lead frame into said recesses of said cutting plate with a shearing action thereby removing said dam bar interconnections from said lead frame.

2. The apparatus of claim 1 wherein said cutting plate comprising a thin piece of metal having a thickness of about 0.06 inches and having a symmetry that allows said cutting plate to be used on both sides.

3. The apparatus of claim 1 wherein said removable punch means comprising at least one symmetrical punch having a substantially rectangular cross sectional cutting surface.

4. The apparatus of claim 3 wherein said lead frame is a four sided lead frame, said symmetrical punch removes said outer metal frame from two of the four sides of said lead frame thereby cutting said metal leads on said two of said four sides of said lead frame to the proper length.

5. The apparatus of claim 3 wherein said symmetrical punch is used to remove said dam bar interconnections from two of the four sides of said lead frame.

6. A method for providing an improved lead frame cutting apparatus for integrated circuit packages including the steps of:
    providing an integrated circuit package comprising, in combination:
        a lead frame comprising a base portion having metal leads that extend from said base portion, and having dam bar metal interconnections located adjacent to said base portion between said metal leads of said lead frame, and having an outer metal frame interconnecting all of said metal leads, said dam bar interconnections and said outer metal frame comprising portions to be removed from said lead frame;
        a semiconductor chip fixedly attached to said base portion of said lead frame and having bonding wires connecting portions of said semiconductor chip to said metal leads of said lead frame means; and
        means for protecting and surrounding said semiconductor chip and said base portion of said lead frame such that said metal leads of said lead frame extend to the exterior of said semiconductor chip;
    providing a thin L-shaped cutting plate upon which said integrated circuit package is placed having recesses that correspond to half of said portions to be removed from said lead frame; and
    providing punching tool means having removable punch means aligned with said recesses in said thin L-shaped cutting plate for exerting a downward force on half of said dam bar interconnections for pressing said dam bar interconnections of said lead frame into said recesses of said cutting plate with a shearing action thereby removing said dam bar interconnections from said lead frame.

7. The method of claim 6 wherein said cutting plate means comprising a thin piece of metal having a thickness of about 0.06 inches and having a symmetry that allows said cutting plate to be used on both sides.

8. The method of claim 6 wherein said removable punch means comprising at least one symmetrical punch having a substantially rectangular cross sectional cutting surface.

9. The method of claim 8 wherein said lead frame is a four sided lead frame, said symmetrical punch removes said outer metal frame from two of the four sides of said lead frame thereby cutting said metal leads on said two of said four sides of said lead frame to the proper length.

10. The method of claim 8 wherein said symmetrical punch is used to remove said dam bar interconnections from two of the four sides of said lead frame.

11. The method of claim 6 further comprising the steps of:
    installing said punch means into said punching tool means;
    positioning said punching tool means in the proper position relative to said cutting plate;

placing said integrated circuit package on said cutting plate;

activating said punching tool means to remove half of said dam bar interconnections to be removed from said lead frame;

rotating said integrated circuit package 180 degrees on said cutting plate; and activating said punching tool means to remove the remaining half of said dam bar interconnections to be removed from said lead frame.

* * * * *